United States Patent
Deluca

(10) Patent No.: US 9,105,786 B2
(45) Date of Patent: Aug. 11, 2015

(54) THERMAL TREATMENT OF SILICON WAFERS USEFUL FOR PHOTOVOLTAIC APPLICATIONS

(75) Inventor: John P. Deluca, Chesterfield, MO (US)

(73) Assignee: Cisco Technology, Inc., San Jose, CA (US)

( * ) Notice: Subject to any disclaimer, the term of this patent is extended or adjusted under 35 U.S.C. 154(b) by 409 days.

(21) Appl. No.: 13/446,450

(22) Filed: Apr. 13, 2012

(65) Prior Publication Data

US 2012/0260989 A1   Oct. 18, 2012

Related U.S. Application Data

(60) Provisional application No. 61/476,371, filed on Apr. 18, 2011.

(51) Int. Cl.
H01L 31/0264 (2006.01)
H01L 31/18 (2006.01)
H01L 31/068 (2012.01)

(52) U.S. Cl.
CPC .......... *H01L 31/068* (2013.01); *H01L 31/1864* (2013.01); *Y02E 10/547* (2013.01)

(58) Field of Classification Search
USPC ................ 438/57–60; 257/E31.011
See application file for complete search history.

(56) References Cited

U.S. PATENT DOCUMENTS

| | | | | |
|---|---|---|---|---|
| 5,627,081 A * | 5/1997 | Tsuo et al. | ....................... | 438/57 |
| 6,815,605 B1 * | 11/2004 | Abe et al. | ....................... | 136/261 |
| 7,923,368 B2 * | 4/2011 | Terry et al. | ....................... | 438/660 |

* cited by examiner

*Primary Examiner* — Cuong Q Nguyen
(74) *Attorney, Agent, or Firm* — Parker Ibrahim & Berg LLC; James M. Behmke; Stephen D. LeBarron

(57) ABSTRACT

Efficiency of silicon photovoltaic solar cells is increased by an annealing process for immobilizing oxygen formed in Czochralski-grown silicon. The annealing process includes a short anneal in a rapid thermal annealing chamber at a high temperature, for example, greater than 1150° C. in an oxygen-containing ambient. More preferably, the wafer is rapidly cooled to less than 950° C. without an intermediate temperature hold, at which temperature oxygen does not nucleate and/or precipitate. Subsequent processing to form a photovoltaic structure is typically performed at relatively low temperatures of less than 1000° C. or even 875° C.

12 Claims, 1 Drawing Sheet

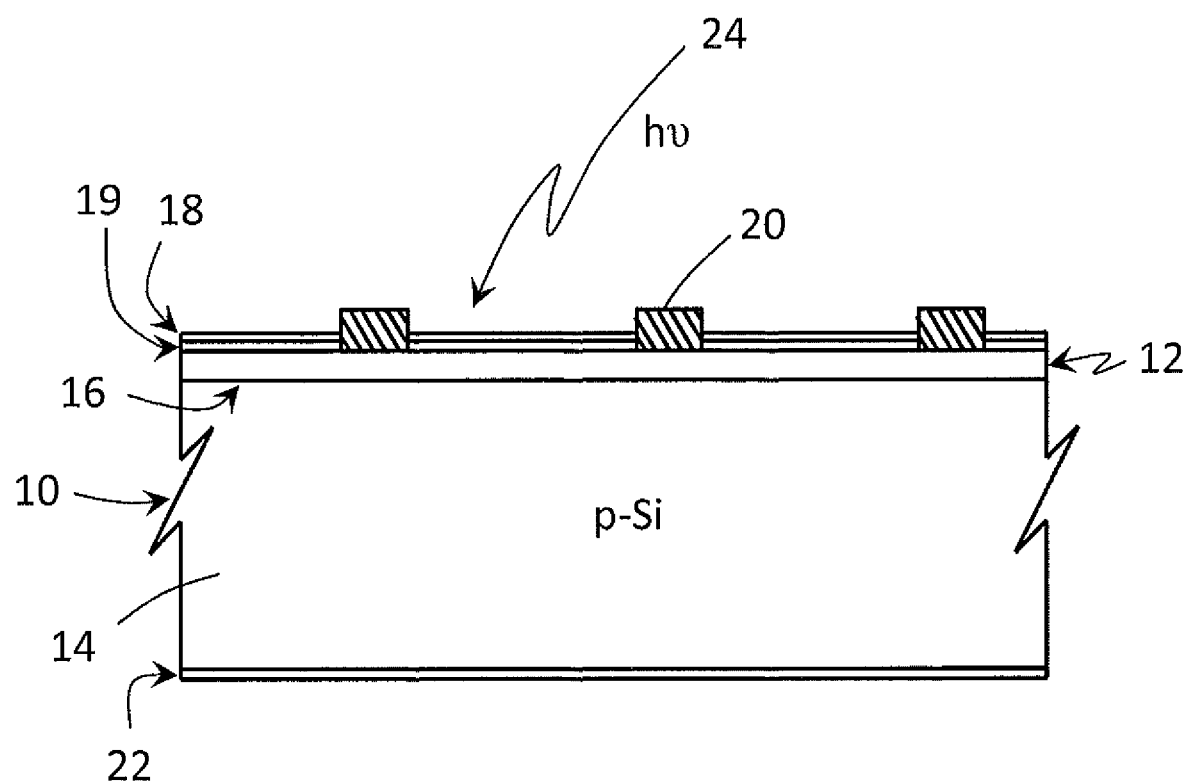

THERMAL TREATMENT OF SILICON WAFERS USEFUL FOR PHOTOVOLTAIC APPLICATIONS

CROSS-REFERENCE TO RELATED APPLICATIONS

The present application claims the benefit of U.S. Provisional Patent Application No. 61/476,371, filed Apr. 18, 2011.

BACKGROUND OF THE INVENTION

1. Field of the Invention.

The invention relates generally to thermal treatment of silicon wafers. In particular, the invention relates to thermal treatment of silicon wafers to be used to make photovoltaic cells.

2. Description of the Related Art.

There is currently great interest and intense development in photovoltaic (PV) solar cells which directly convert solar radiation to electrical power. Although many different configurations and even different semiconductor materials have been proposed, an efficient and economical solar cell can be fabricated using structures, materials, and techniques long known for silicon integrated circuits. Specifically, a single crystal or multi-crystalline silicon wafer is processed to have a large-area p-n junction extending across a substantial fraction of the wafer. One class of silicon PV cell is made on wafers cut from an ingot of monocrystalline silicon grown by the Czochralski (CZ) process in which a monocrystalline silicon seed crystal is used to start the freezing of silicon by contacting silicon melt held at about 1420° C. and the silicon ingot is drawn from the melt. The melt is contained in a heated crucible conventionally composed of fused quartz (silicon dioxide). A single silicon ingot intended for integrated circuits or PV applications is typically drawn from a crucible which is discarded after a single ingot. On the other hand, solar applications may benefit economically from a so-called continuous Czochralski process in which multiple ingots are drawn from a crucible which is recharged with silicon during the drawing process.

Silicon wafers usable for solar cells consist of elemental silicon and less than a total of 1 at % of dopants, oxygen, and other impurities. All monocrystalline silicon produced by the CZ process contains low but significant levels of oxygen in the ingot, typically at concentrations of about $1 \times 10^{18}$ cm$^{-3}$ or 20 ppma (parts per million atomic) relative to the silicon. The oxygen originates primarily from the quartz crucible. At the growth temperature, most of the oxygen is interstitial in the lattice, that is, single oxygen atoms residing in the interstices of the crystalline silicon lattice. However, some of the oxygen agglomerates together in various atomic configurations, also called cluster or oxygen precipitate nuclei. The precipitate nucleation occurs because, after crystallization at the silicon melting point of around 1420° C., as the crystal cools as the growing ingot is drawn away from the melt, oxygen becomes supersaturated in the silicon lattice. As a result, the free energy of the system is lowered by oxygen clustering as the ingot cools. Some of the oxygen coalesces around several silicon atoms to form small clusters called nuclei of size between about 6 and 35 nm. More nuclei can form if the crystal is post heated to between 650 and 850° C. Very rapid heating will dissolve the nucleated oxygen nuclei. However, in the as grown ingot, a long anneal above about 1000° C. will cause the oxygen to form much larger precipitates up to a few microns in size. Rapid heating cannot dissolve these large precipitates.

The initial clusters and nuclei are referred to as "grown in" defects. Both nuclei and precipitates are considered to be defects in the lattice which act as recombination centers or traps for electrons and holes in the crystalline solid, thereby decreasing the critical parameter for high-efficiency solar cells of minority carrier recombination lifetime. Removal or elimination of these oxygen defects increases the minority carrier lifetime (mel) in the silicon. Oxygen may further degrade an operating boron-doped silicon PV cell by causing a photo-induced degradation in which the solar irradiation activates the formation of boron-oxygen scattering in the silicon.

For the past thirty years, the effects of oxygen in CZ silicon for integrated circuit (IC) applications have been extensively studied. During CZ growth, oxygen in the silicon melt is incorporated into the growing silicon ingot typically in isolated interstitial locations in the silicon crystalline lattice at concentrations stable at the high temperatures. However, as the ingot gradually cools as it is slowly drawn from the melt, the equilibrium oxygen solubility limit decreases and oxygen incorporated at the interface during growth becomes super saturated. Assuming a moderately high temperature above for example 1200° C., the oxygen can diffuse through the silicon lattice to form a lower-energy state of oxygen precipitates believed to be regions of a few oxygen atoms in associated or chemically bonded with silicon in the lattice. Such oxygen precipitates act as defects which strain the silicon lattice and therefore act as gettering centers for metallic impurities during subsequent heat treatment typically experienced during semiconductor device fabrication. Except where those precipitates are near the surface, they are usually not important for integrated circuit applications. However, these oxygen precipitates (also referred to as gettering sites) throughout the entire wafer dramatically lower the minority carrier recombination lifetime of silicon, which is critically important for solar cells.

It has been observed that silicon with an oxygen concentration of less than 10 to 13 ppma (parts per million atomic, as measured according to the ASTM (American Society for Testing and Materials) standard for measuring oxygen in silicon) will not experience significant oxygen precipitation during device fabrication. Single crystal silicon can be also produced formed by the float zone (FZ) process, which does not use a quartz crucible. The FZ process produces silicon containing little if any oxygen, for example, less than 1 ppma oxygen dissolved in the silicon lattice. FZ silicon exhibits very high minority carrier lifetimes arising from the absence of oxygen defects and it thus enables high efficiency PV cells to be produced. However, FZ silicon is prohibitively expensive and is not used in commercial-scale terrestrial solar cell applications.

For CZ silicon, various techniques are applied to reduce the oxygen concentration in the ingot to below 13 ppma but the techniques introduce operational constraints and have not been completely successful.

Most modern IC's have active semiconductor devices formed in a surface region within about a few microns of the original wafer surface. For all IC types, low oxygen precipitation in the active surface region is not desired. On the other hand, for high yield in IC fabrication, controlled oxygen precipitation in the central plane of the wafer is desired because the precipitates not only "getter" metallic impurities but also increase the strength of the silicon substrate during the many high-temperature processing steps required for advanced IC's. Controlled oxygen nucleation and precipitation away from the surface of the silicon wafer help pin dislocations due to process induced thermal stress and thus reduce the tendency for crystallographic slip and wafer warping without interfering with the active devices which are usually within the first 20 microns from the surface. In addition to imparting strength, oxygen is desired during IC processing because the lattice strain caused by precipitates getters metals towards the precipitates and away from the active devices, thereby improving yield and performance of the IC's. Further, because almost all the IC's made today are majority carrier devices, such as MOSFET's, minority carrier lifetime is not considered to be very important. In fact, metals are often deliberately introduced by ion implantation to "kill" lifetime in specific regions around the IC devices. For these reasons, a "denuded zone" process has been developed for reducing oxygen precipitation in the surface layer but leaving some precipitates in the wafer interior. Falster describes the denuded zone process in the background section of U.S. Pat. No. 6,336,968, incorporated herein by reference in its entirety.

Falster further describes, what is sometimes called, a tabula rasa process to avoid oxygen precipitation when the wafer is used in the fabrication of an electronic integrated circuit such as a DRAM. It is important in IC's not only to reduce the precipitates but also to prevent their reformation in the surface region during subsequent hot processing such as a long anneal at a temperature of 1000° C. In the Falster process performed before IC processing, the silicon wafer is subjected to a fast anneal in a rapid thermal processing (RTP) chamber at a temperature of greater than 1150° C. in an oxygen ambient. Falster believes that the high-temperature oxygen anneal reduces vacancies and thus prevents precipitation near the surface region during high-temperature processing used for IC's.

The Falster process is believed to prevent oxygen precipitation near the surface regions and thus does not enjoy the advantages of interior oxygen precipitation described above for the denuded zone process.

SUMMARY OF THE INVENTION

A silicon wafer suitable for solar cell applications is annealed for a short time at an elevated temperature in an oxygen-containing environment to dissolve any oxygen nuclei and/or precipitates in the crystalline lattice. The wafer is cooled to a temperature below which oxygen precipitates. Thereby, minority carrier lifetime is increased, which is important for photovoltaic solar cell performance.

The fabrication steps of forming the solar cell are performed at relatively low temperatures at which oxygen can nucleate but not grow precipitates.

Advantageously, cooling from the annealing temperature to less than 900° C. is performed quickly, for example, at greater than 10 or 20° C./s with no holding period.

BRIEF DESCIPTION OF THE DRAWINGS

FIG. 1 is a cross-sectional view of a solar cell using a silicon wafer processed according to an embodiment of the invention.

DETAILED DESCRIPTION OF THE INVENTION

The need for highly efficient solar cells imposes somewhat different requirements on silicon wafers used for PV applications than for wafers used for integrated circuits. One of the prime requirements for wafers for PV applications is a high minority carrier lifetime (mcl) since the product of the square root of the mcl multiplied by the diffusion coefficient of the minority carrier determines the distance over which the photo-generated minority carriers in PV cells can effectively diffuse before recombining with majority carriers. The greater this diffusion distance, the higher the probability that the minority carrier will reach the p-n junction (referred to as the solar cell emitter) without recombining with the abundant majority carriers in the silicon. Long lifetime is necessary but not sufficient. Several other requirements need be satisfied for single crystal silicon wafers to be useful in PV applications, such as proper resistivity, low carbon concentration, large diameter and proper thickness. Assuming these other parameters are satisfactory, increased minority carrier lifetime has a dramatic positive effect on the efficiency of a solar cell. Generally, high lifetimes enable higher cell efficiency.

Oxygen may be dissolved throughout the silicon wafer by a process related to the Falster process described in the cited patent even though the process is not needed for any subsequent high-temperature oxygen precipitation anneal. A silicon ingot is grown according to the Czochralski process. Abe et al. describe the equipment for a magnetic version of the Czochralski process in U.S. Pat. No. 6,815,605, incorporated herein by reference in its entirety. The silicon melt may contain a dopant to form a semiconductor of the desired conductivity type. After the ingot is drawn from the melt in the crucible, it is cut into thin wafers by a wire or circular saw to a thickness for PV applications typically between 140 and 350 micrometers and more preferably between 150 and 200 micrometers. After sawing, the wafers are typically cleaned and possibly etched to remove impurities and sawing damage. After surface finishing, each CZ wafer is annealed in a rapid thermal processing (RTP) chamber including a bank of radiant lamps, such as tungsten halogen incandescent lamps, closely facing the wafer. An example of an RTP chamber is a model 610 furnace available from AG Associates of Mountain View, Calif. The intense electrically switched lamps can rapidly bring the wafer to a temperature of at least 1150° C., preferably at least 1175° C., more preferably at least 1200° C., and most preferably between 1200 and 1275° C. RTP has the capability of bringing the wafer to such elevated temperature in a very short time, for example, 1 second. The anneal may be performed at the elevated temperature for at least one second, for example, 3 seconds; preferably for a plurality of tens of seconds, but typically less than sixty seconds.

The anneal is performed in an oxygen-containing ambient, for example, oxygen gas ($O_2$), water vapor, or an oxygen-containing gaseous compound. Oxygen gas is preferred. The ambient may additionally contain a non-oxidizing or inert gas such as argon. The ambient should contain an oxygen partial pressure of at least 0.76 Tarr (0.001 atm. or 1000 ppma if the ambient is at atmospheric pressure). More preferably the oxygen partial pressure is 1.52 Torr (0.002 atm.); still more preferably, 3.8 Torr (0.005 atm.); and yet still more preferably 7.6 Torr (0.01 atm.).

RTP chambers operate with cold walls so that after the anneal the wafer temperature quickly drops if the radiant lamps are completely turned off. A slower cool down is possible if the radiant power is gradually reduced. In order to reduce oxygen diffusion and hence oxygen nuclei formation and/or precipitation during initial cool down and for increased through put, it is preferred that the cool down rate be relatively high, specifically greater than 20° C./s, down to less than 1150° C., below which temperature the oxygen diffusion is lowered and hence further oxygen precipitation effectively stops. For his IC applications, Falster recommends as part of the fast cool down holding the wafer temperature at a temperature between 950 and 1150° C. to reduce the number of vacancies. On the other hand, PV applications do not require the high processing temperatures typical of IC fabrication so Falster's 950 to 1150° C. hold period is not required for PV wafers. Further, vacancies are much less important in the low-temperature processing for solar cells so a rapid cool down at greater than 10° C./s can continue without a hold period down to 950° C. and below to more rapidly complete the anneal of this embodiment of the invention. Nonetheless, the alternative cooling and holding steps described by Falster may be included within alternative embodiments of the invention.

The ambient during the cool down may be oxidizing (oxygen-containing) as in the annealing step, nitriding such as containing nitrogen gas or ammonia, or inert such as argon either alone or in combination with the oxidizing or nitriding component.

It is believed that the described anneal process effectively dissolves into the silicon lattice almost all oxygen which is in oxygen nuclei and precipitates. The annealed silicon wafer is then ready for processing into a solar cell. Wafer processing for photovoltaic solar cells is performed at relatively low temperatures in the vicinity of 850° C. for tens of minutes. Two or more such heat cycles may complete the photovoltaic fabrication.

An exemplary silicon solar cell is illustrated in the cross-sectional view of FIG. 1. A CZ wafer 10 annealed according to the invention is uniformly doped during CZ growth with a dopant giving the desired semiconductor conductivity type, for example, p-type doped with boron or gallium. A dopant which produces the opposite conductivity type, n-type in the example, which may be phosphorous is thermally diffused from the surface to sufficiently counter-dope the p-dopant to form a relatively thin silicon n-type layer 12 overlying a thicker silicon p-type layer 14 and separated from it by a p-n junction 16. An upper electrode layer 18 of a transparent conductor, such as indium tin oxide, is formed over the n-type layer 12. Typically, a grid 20 of a metallic conductor is formed over the mostly unpatterned upper or n-type layer 12. A surface passivation layer 19, for example of silicon nitride or silicon oxide, is applied followed by an anti-reflective layer 18 typically of silicon nitride. A lower electrode layer 22 needs not be transparent and thus may be metallic. The illustrated pattern may extend across the entire wafer to form a single solar cell or further patterning may be used to form serially connected multiple photovoltaic cells on the wafer. The processing may include, for example, in diffusing of n-type phosphorous typically performed at 835 to 875° C. for 20 to 40 minutes and co-firing of the metallization on the front and back of the wafer in a two-step process of 300 to 400° C. for 10 to 30 minutes to remove organics followed by a higher-temperature anneal step at between 650 to 900° for 5 to 20 min. Such low temperatures and short times are insufficient to reform the oxygen precipitates and thus degrade the minority carrier lifetime. These solar cell processing temperatures of less than 1000° C. and often less than 950° C. or even less than 875° C. and maybe even less than 800° C. or 700° C. are in the range of temperatures for which oxygen precipitate nuclei will not form and the time is so short that few if any nuclei are formed. In any event, such processing does not constitute an oxygen precipitation heat treatment motivating the Falster process. In some applications, the solar wafer is diced into multiple smaller solar cell chips.

In operation, solar radiation 24 strikes the top surface of the solar cell and generates electron-holes pairs which diffuse to the emitter and collector electrodes 20, 22 providing electrical current and power to an electrical load connected across the electrodes 20, 22.

The invention allows the use of Czochralski wafers for PV applications having a relatively high oxygen concentration, for example, greater than 10 ppma or even greater than 20 ppma but the "grown in" nuclei and small oxygen precipitates are virtually eliminated by appropriate high-temperature thermal treatment of the wafer before processing of the wafer into one or more photovoltaic devices.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A process for forming a photovoltaic solar wafer, comprising the steps of:
    growing a silicon ingot by the Czochralski process;
    mechanically forming a plurality of silicon wafers from the ingot;
    annealing at least one of the wafers at an annealing temperature of greater than 1150° C. in an oxygen-containing ambient for a time of between 1 and 60 seconds; and
    then fabricating a photovoltaic solar cell structure including a semiconductor junction in the at least one wafer at processing temperatures of less than 1000° C.

2. The process of claim 1, further comprising cleaning the at least one wafer between the forming step and the annealing step.

3. The process of claim 1, wherein the annealing step is performed in a rapid thermal processing chamber including a plurality of incandescent heating lamps directed at one of the at least one wafer.

4. The process of claim 1, wherein the ambient contains a partial pressure of at least 0.76 Torr of an oxygen-containing gas.

5. The process of claim 4, wherein the oxygen-containing gas comprises oxygen gas ($O_2$).

6. The process of claim 1, wherein the annealing temperature is in a range of 1200 to 1275° C.

7. The process of claim 6, further comprising the step performed between the annealing and fabricating steps of cooling the wafer from the annealing temperature to less than 1150° C. at a cooling rate of at least 20° C./s.

8. The process of claim 7, wherein the cooling step includes no intermediate holding step during which the cooling rate is less than 20° C./s.

9. The process of claim 7, wherein the cooling step cools the wafer to no more than 950° C.

10. The process of claim 7, wherein the cooling step cools the wafer at a cooling rate of at least 10° C./s over all parts of a temperature range extending from the annealing temperature to less than 950° C.

11. The process of claim 1, wherein the processing temperatures are no more than 950° C.

12. The process of claim 1, wherein the silicon ingot has an oxygen concentration of greater than 25 ppma.

* * * * *

UNITED STATES PATENT AND TRADEMARK OFFICE
CERTIFICATE OF CORRECTION

Page 1 of 1

PATENT NO.       : 9,105,786 B2
APPLICATION NO.  : 13/446450
DATED            : August 11, 2015
INVENTOR(S)      : John P. DeLuca It is certified that error appears in the above-identified patent and that said Letters Patent is hereby corrected as shown below:

On The Title Page, item (73) Assignee should read -- GTAT IP HOLDING LLC., San Jose, CA (US) --

Signed and Sealed this
Fifteenth Day of December, 2015

Michelle K. Lee
*Director of the United States Patent and Trademark Office*